(12) United States Patent
Chien et al.

(10) Patent No.: US 7,960,224 B2
(45) Date of Patent: Jun. 14, 2011

(54) OPERATION METHOD FOR MULTI-LEVEL SWITCHING OF METAL-OXIDE BASED RRAM

(75) Inventors: Wei-Chih Chien, Taipei (TW); Kuo-Pin Chang, Yuanli Township (TW); Yi-Chou Chen, Hsinchu (TW); Erh-Kun Lai, Elmsford, NY (US); Kuang-Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 70 days.

(21) Appl. No.: 12/388,655

(22) Filed: Feb. 19, 2009

(65) Prior Publication Data

US 2009/0154222 A1    Jun. 18, 2009

Related U.S. Application Data

(63) Continuation-in-part of application No. 11/695,780, filed on Apr. 3, 2007, now Pat. No. 7,524,722.

(60) Provisional application No. 61/050,798, filed on May 6, 2008.

(51) Int. Cl.
*H01L 21/8238* (2006.01)

(52) U.S. Cl. . 438/199; 438/238; 438/381; 257/E21.006; 257/E21.077; 257/E21.051; 257/E21.229; 257/E21.304; 257/E21.311; 257/E21.632; 257/E21.645

(58) Field of Classification Search .................. 438/197, 438/199, 238, 381, 513, 692; 257/E21.006, 257/51, 77, 229, 304, 311, 632, 645

See application file for complete search history.

(56) References Cited

U.S. PATENT DOCUMENTS

| | | | |
|---|---|---|---|
| 5,534,711 A | 7/1996 | Ovshinsky et al. | |
| 6,714,448 B2 | 3/2004 | Manea | |
| 7,084,691 B2 * | 8/2006 | Hsu | 327/308 |
| 7,524,722 B2 * | 4/2009 | Lee et al. | 438/381 |
| 2003/0001178 A1 | 1/2003 | Hsu et al. | |
| 2007/0121386 A1 | 5/2007 | Ho et al. | |
| 2008/0068885 A1 | 3/2008 | Kong et al. | |
| 2008/0304312 A1 * | 12/2008 | Ho et al. | 365/148 |

FOREIGN PATENT DOCUMENTS

CN    1574363 A    2/2005

(Continued)

OTHER PUBLICATIONS

Antonaia, A., et al., "Transport mechanism and IR structural characterisation of evaporated amorphous $WO_3$ films," This Solid Films 426 (2003) 281-287.

(Continued)

*Primary Examiner* — David Nhu
(74) *Attorney, Agent, or Firm* — Hayes Beffel & Wolfeld LLP (57) ABSTRACT

A method for operating a memory device includes applying a sequence of bias arrangements across a selected metal-oxide memory element to change among resistance states. The sequence of bias arrangements includes a first set of one or more pulses to change the resistance state of the selected metal-oxide memory element from the first resistance state to a third resistance state, and a second set of one or more pulses to change the resistance state of the selected metal-oxide memory element from the third resistance state to the second resistance state.

15 Claims, 11 Drawing Sheets

FOREIGN PATENT DOCUMENTS

| | | |
|---|---|---|
| CN | 1604210 A | 4/2005 |
| TW | 095137507 | 10/2006 |
| WO | WO-2005024839 A1 | 3/2005 |

OTHER PUBLICATIONS

Aratani, K., et al., "A Novel Resistance Memory with High Scalability and Nanosecond Switching," IEEE 2007, 783-786.

Lee, Myoung-Jae, et al., "2-stack 1D-1R Cross-point Structure with Oxide Diodes as Switch Elements for High Density Resistance RAM Applications," IEEE 2007, pp. 771-774.

Ogimoto, Yasushi, et al., "Resistance switching memory device with a nanoscale confined current path," Applied Physics Letters 90 142515 (2007) 3 pages.

Sakamoto, Toshitsugu, et al., "Electronic transport in $Ta_2O_5$ resistive switch," Applied Physics Letters 91 092110 (2007), 3 pages.

Tsunoda, K., et al., "Low Power and High Speed Switching of Ti-doped NiO ReRAM under the Unipolar Voltage Source of less than 3V," IEEE 2007, 767-770.

English translation from the Chinese of pertinent portions of the Search Report mailed Aug. 19, 2010 in the co-pending Chinese family member application No. CN2009010137990, 2 pages.

* cited by examiner

OPERATION METHOD FOR MULTI-LEVEL SWITCHING OF METAL-OXIDE BASED RRAM

CROSS-REFERENCE TO RELATED APPLICATIONS

This application is a continuation-in-part of U.S. application Ser. No. 11/695,780 entitled "Resistance Type Memory Device and Fabrication Method and Operating Method Thereof" filed on 3 Apr. 2007 (now U.S. Pat. No. 7,524,722), which is incorporated by reference herein, which application claims the priority benefit of Taiwan application serial no. 95137507, filed Oct. 12, 2006, and incorporates the disclosure of said Taiwan application therein by reference.

This application claims the benefit of U.S. Provisional Patent Application No. 61/050,798 entitled "Operation Method for Multi-Level Switching of Metal-Oxide Based RRAM" filed on 6 May 2008, which is incorporated by reference herein.

BACKGROUND OF THE INVENTION

1. Field of the Invention

The present invention relates to metal-oxide based memory devices and methods for operating such devices.

2. Description of Related Art

Some metal-oxides can be caused to change resistance between two or more stable resistance ranges by application of electrical pulses at levels suitable for implementation in integrated circuits, thus providing a basis for use in nonvolatile resistive random access memory RRAM.

Metal-oxide based RRAM has attracted much attention because of its simple structure, high speed, low power consumption, and potential for 3D stacking.

In metal-oxide based memory, data is stored by applying energy pulses to the metal-oxide material to induce a change in resistance of the metal-oxide material between two or more resistance states including a low resistance state (LRS) and one or more higher resistance states (HRS).

Multi-level operation involves changing the resistance of the metal-oxide material between more than two resistance states and is desirable since the data storage density can be increased and the process costs can be reduced.

In order to reliably distinguish between the various resistance states, and thus properly determine the data value stored in a memory cell, it is important to maintain relatively large resistance windows between the states. However, endurance problems have arisen in metal-oxide materials due to instability of the resistance which reduces the resistance window between the various states, resulting in reliability issues and possible bit errors of the device.

It is therefore desirable to provide metal-oxide based memory devices and methods for operating such devices which address the endurance problems discussed above and result in improved reliability and data storage performance of the device.

SUMMARY OF THE INVENTION

A method is described herein for operating a memory device comprising a plurality of metal-oxide memory elements programmable to a plurality of resistance states. The method comprises applying a sequence of bias arrangements across a selected metal-oxide memory element to change the resistance state of the metal-oxide memory element from a first resistance state in the plurality of resistance states to a second resistance state in the plurality of resistance states. The sequence of bias arrangements comprises a first set of one or more pulses to change the resistance state of the selected metal-oxide memory element from the first resistance state to a third resistance state in the plurality of resistance states, and a second set of one or more pulses to change the resistance state of the selected metal-oxide memory element from the third resistance state to the second resistance state. In embodiments the third resistance state can be a lower resistance state than the first and second resistance states, for example being the lowest resistance state used to represent data in the memory element.

A memory device as described herein comprises a plurality of metal-oxide memory elements programmable to a plurality of resistance states. The memory device further comprises bias circuitry adapted to apply bias arrangements across the metal-oxide memory element including a sequence of bias arrangements as described above.

Memory devices and methods for operating such devices described herein not only provide more control over the resistance distribution of the various states but also address the endurance problems discussed above and result in improved reliability and data storage performance of the device. The operating methods described herein of returning to the lower resistance state even when the lower resistance state is not the desired programmed state are shown to result in good cycle endurance and good control of the resistance of the memory element.

Other aspects and advantages of the present invention can be seen on review of the drawings, the detailed description, and the claims which follow.

DETAILED DESCRIPTION

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

Figure 1:
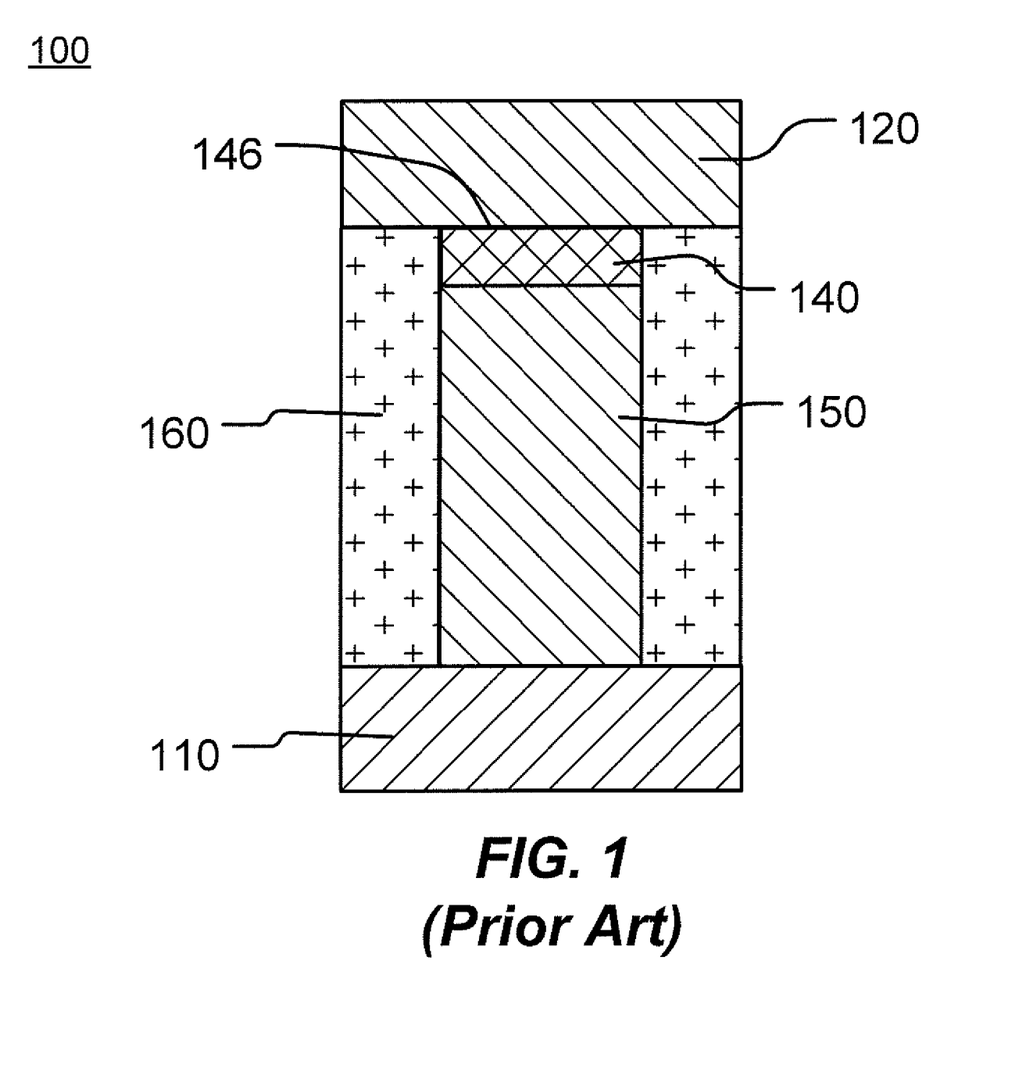
FIG. 1 is a cross-sectional view of a prior art metal-oxide based memory cell.

FIG. 1 illustrates a cross-sectional view of a prior art metal-oxide based memory cell 100. The memory cell 100 includes a conductive element 150 extending through dielectric 160 to couple a bottom electrode 110 to a memory element 140. The dielectric 160 comprises silicon oxide in the illustrate embodiment, although other dielectric materials can alternatively be used.

The memory element 140 comprises at least one programmable metal-oxide, and in the illustrated embodiment the conductive element 150 comprises tungsten and the memory element 140 comprises tungsten-oxide $WO_x$. In embodiments the memory element 140 can have a variation in distribution of oxygen content of $WO_x$ compounds with depth from the top surface 146 which results in both monotonically decreasing ion valence values ($W^{+6}$, $W^{+5}$, $W^{+4}$, and $W^0$), as well as lower oxygen content in the deeper regions. In alternative embodiments the memory element 140 may comprise other metal-oxides, for example a metal-oxide from the group of nickel oxide, aluminum oxide, copper oxide, cobalt oxide, magnesium oxide, hafnium oxide, and titanium oxide.

The bottom electrode 110 is an electrically conductive element. For example, the bottom electrode 110 may be doped semiconductor material such as a terminal of an access transistor. Alternatively, the bottom electrode 110 may comprise, for example, one or more elements selected from the group consisting of Ti, W, Mo, Al, Ta, Cu, Pt, It, La, Ni, N, O, and Ru and combinations thereof, and in some embodiments may comprise more than one layer.

The memory cell 100 also includes a top electrode 120 on the memory element 140. The top electrode 120 (which in some embodiments is a portion of a bit line) may comprise, for example, any of the materials discussed above with reference to the bottom electrode 110, and in some embodiments may comprise more than one layer.

The memory element 140 can be formed by an oxidation process following conventional back-end-of-line W-plug process of depositing W material within a via and performing a CMP process, resulting in the memory element 140 located between the conductive element 150 and the subsequently formed material of the top electrode 120. Methods for forming the tungsten-oxide memory element 140 include direct plasma oxidation, down-stream plasma oxidation, sputtering, and reactive sputtering. Embodiments for the plasma oxidation process include a pure $O_2$ gas chemistry, or mix chemistries such as $O_2/N_2$, or $O_2/N_2/H_2$. In one embodiment of the down-stream plasma, the down-stream plasma is applied with a pressure of about 1500 mtorr, a power of about 1000 W, an $O_2/N_2$ flow of about 3000 sccm/200 sccm, a temperature of about 150° C., and a time duration of about 400 seconds. See, for example, U.S. patent application Ser. No. 11/955,137, which is incorporated by reference herein.

Reading or writing to the memory cell 100 can be achieved by applying appropriate bias arrangements across the memory element 140 to induce a current through the memory element 140. The bias arrangements may each comprise one or more pulses applied across the memory element 140 by applying pulses to one or both of the top and bottom electrode 120, 110, and the levels and durations of the pulses can be determined empirically for each embodiment. The one or more pulses applied is dependent upon the operation performed, e.g. a reading operation or a programming operation.

The bias arrangements may include pulses having a positive voltage from the top electrode 120 to the bottom electrode 110 (referred to herein as a positive voltage across the memory element 140), and/or may include pulses having a negative voltage from the top electrode 120 to the bottom electrode 110 (referred to herein as a negative voltage across the memory element 140). The resistance of the metal-oxide depends on the applied power or energy, and thus the pulse voltage and pulse width applied across the memory element 140 determine the resistance of the metal-oxide.

Figure 9:
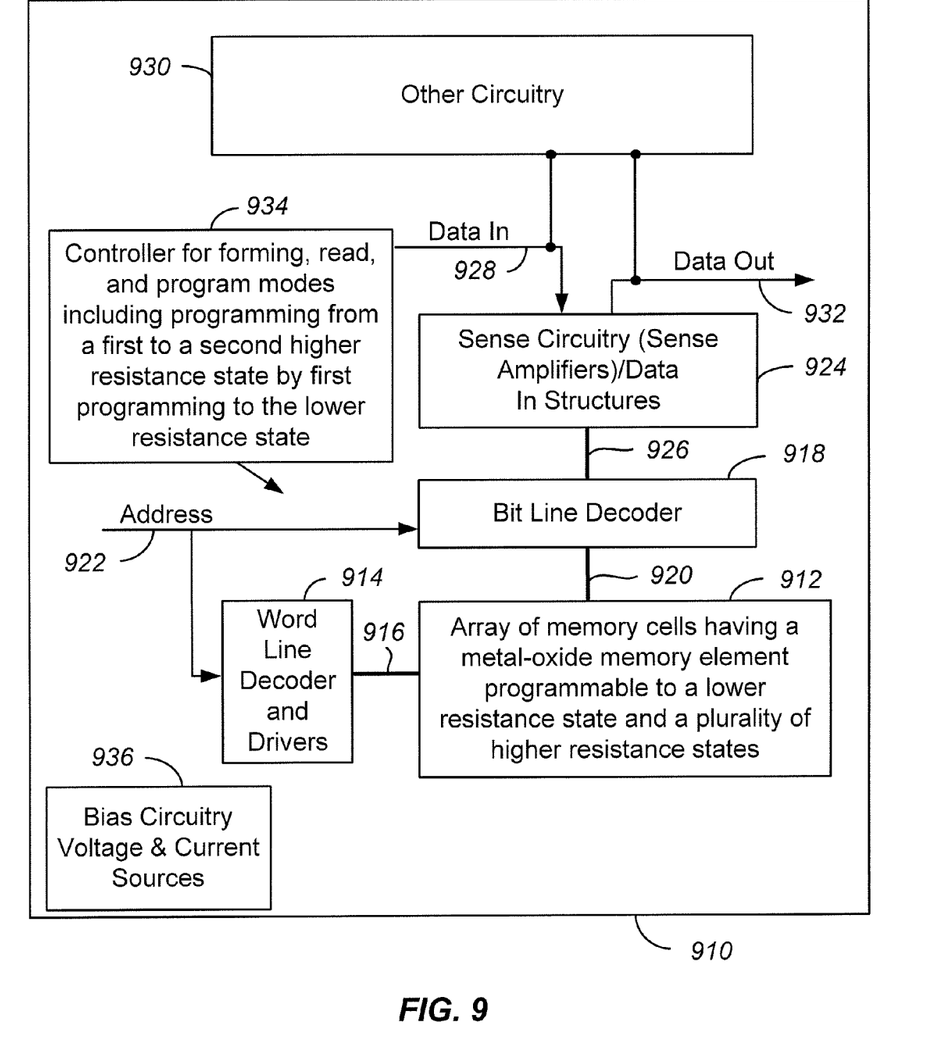
FIG. 9 is a simplified block diagram of an integrated circuit in which the programming operations described herein can be implemented.

In a read (or sense) operation of the data value stored in the memory cell 100, bias circuitry (See, for example, bias circuitry voltage & current sources 936 of FIG. 9) coupled to the top and bottom electrodes 120, 110 applies bias arrangements across the memory element 140 of suitable amplitude and duration to induce current to flow which does not result in the memory element 140 undergoing a change in resistive state. The current in the memory element 140 is dependent upon the resistance of the memory element 140 and thus the data value stored in the memory cell 100.

In a program operation of a data value to be stored in the memory cell 100, bias circuitry (See, for example, bias circuitry voltage & current sources 936 of FIG. 9) coupled to the top and bottom electrodes 120, 110 applies bias arrangements across the memory element 140 sufficient to induce a programmable change in the memory element 140 to store the data value in the memory cell 100, the resistance of the memory element 140 corresponding to the data value stored in the memory cell 100.

As described above, endurance problems have arisen in metal-oxide materials due to instability of the resistance which reduces the resistance window between the various states, resulting in reliability issues and possible failure of the device.

Figure 2:
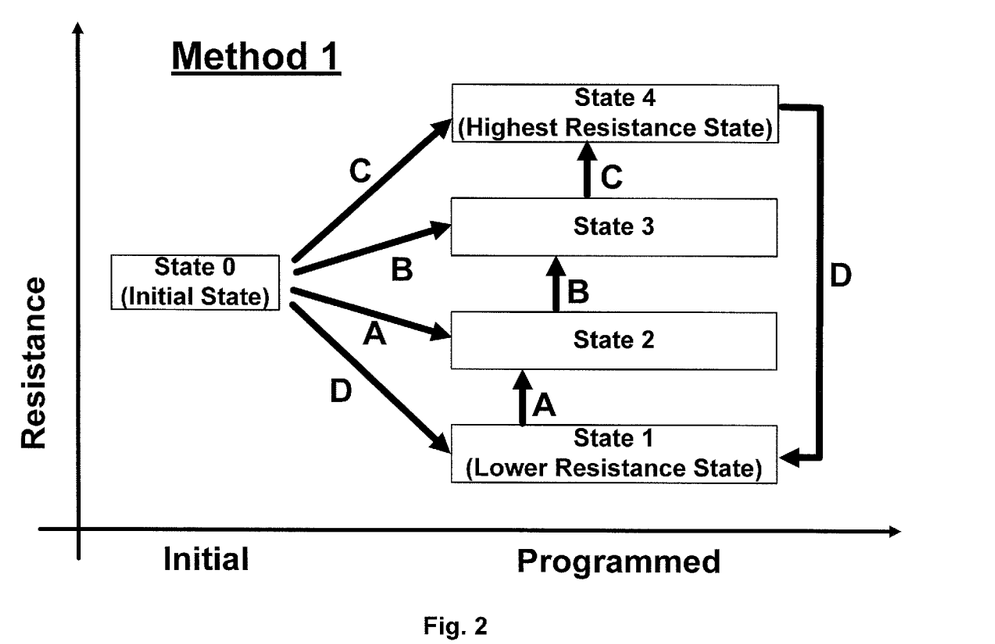
FIG. 2 conceptually illustrates the resistive state change behavior of the memory element along with a first embodiment of a programming operation as described herein.

FIG. 2 conceptually illustrates the resistive state change behavior of memory element 140 along with a first embodiment of a programming operation as described herein.

In FIG. 2 the memory element 140 is programmable to a lower resistance state (State 1) and three higher resistance states (State 2, State 3, State 4) including a highest resistance state (State 4). However, it will be understood that the present invention more generally includes programming memory cells to a lower resistance state and two or more higher resistance states.

Each of the four programmed states (State 1, State 2, State 3, and State 4) correspond to non-overlapping resistance ranges of the memory element 140, and thus the data value stored can be determined by determining which resistance state the resistance of the memory element 140 is within. In FIG. 2 the lower resistance state (State 1) is the lowest resistance state used to represent data in the memory element 140. In embodiments the memory element 140 may also include an initial resistance state ("State 0") when manufactured as shown in FIG. 2, which may also be used to represent data in some embodiments.

As represented by the arrows in FIG. 2, the programming operation follows along a sequence from State 1 (Lower Resistance State) to State 2 to State 3 to State 4 (Highest Resistance State) and back to State 1. To change the resistance state from State 1 to State 2 pulse set A is applied across the memory element 140, to change from State 2 to State 3 pulse set B is applied across the memory element 140, to change from State 3 to State 4 pulse set C is applied across the memory element 140, and to change from State 4 to State 1 pulse set D is applied across the memory element 140. The pulse sets (or groups) A, B, C, and D each comprise one or more pulses. The levels, voltage polarity across the memory element, and pulse times of the pulses can be determined empirically for each embodiment. As used herein the term "a set of pulses" refers generally to pulses of one or more pulse sets.

The programming operation of FIG. 2 involves applying bias arrangements across the memory element 140 comprising a sequence of one or more of pulse sets A, B, C, and D to change the resistance state from a particular state to a desired state. For example, the bias arrangement applied across the memory element 140 to change the resistance state from State 1 to State 3 involves applying pulse set A to induce a change from State 1 to State 2, and applying pulse set B to induce a change from State 2 to State 3. As another example, the bias arrangement applied across the memory element 140 to change the resistance state from State 3 to State 2 involves applying pulse set D to induce a change from State 4 to State 1, applying pulse set A to induce a change from State 1 to State 2, and applying pulse set B to induce a change from State 2 to State 3.

In FIG. 2 the pulse sets A, B, C, and D are also applied to change the resistance state of the memory element 140 from the initial state (State 0) to a corresponding programmed state. Alternatively, other pulses may be used.

Figure 3:
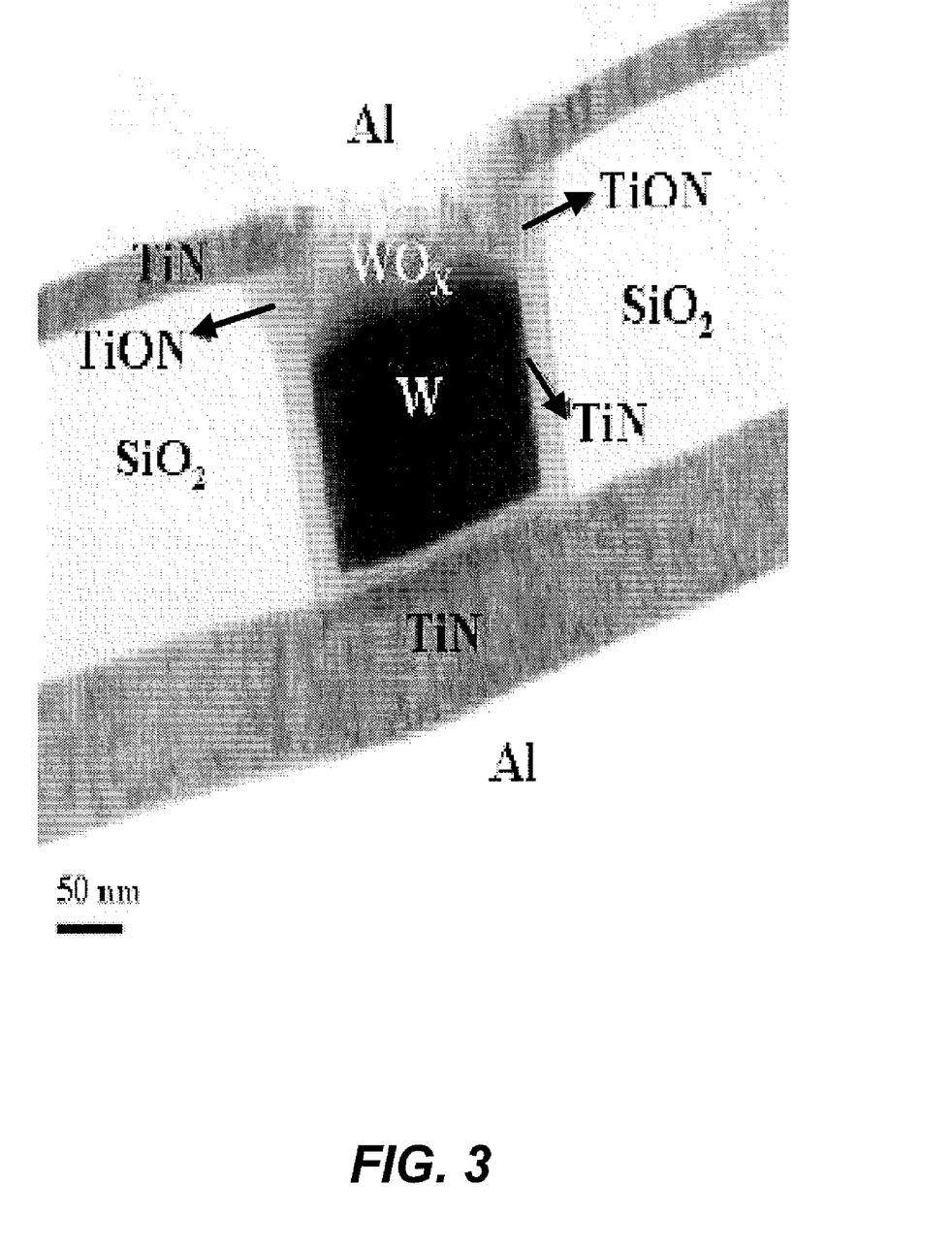
FIG. 3 is a TEM image of a memory cell having a tungsten-oxide memory element.
Figure 4:
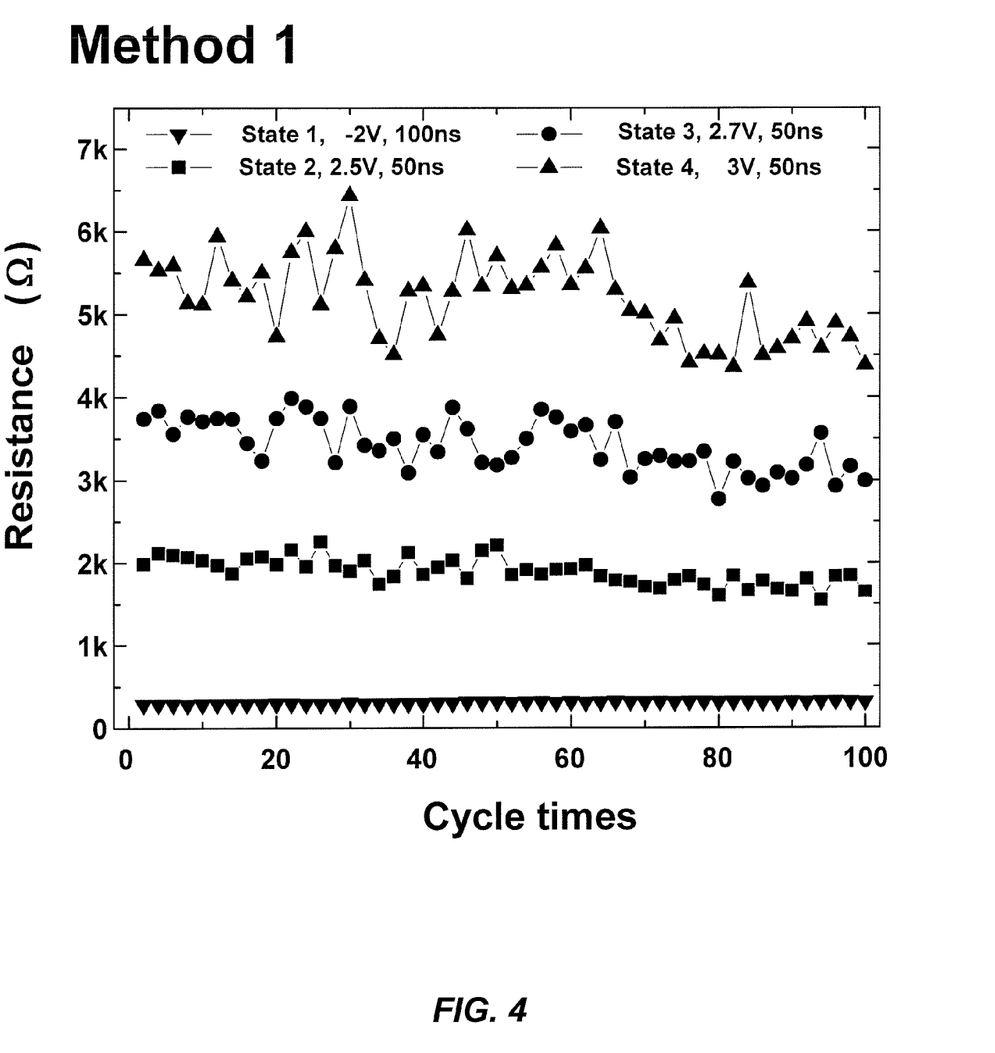
FIG. 4 are measured results of the memory cell of FIG. 3 using the programming operation of FIG. 2.

FIG. 3 is a TEM image of a memory cell having a tungsten-oxide $WO_x$ memory element, and FIG. 4 are measured results of the memory cell of FIG. 3 using the programming operation of FIG. 2.

The structure of the memory cell shown in FIG. 3 is similar to the structure of the memory cell 100 of FIG. 1 and includes a liner layer of TiN/TiON, a bottom electrode of Al and TiN, and a top electrode of Al and TiN. The tungsten-oxide memory element of the memory cell of FIG. 3 was formed by a down stream plasma oxidation process following conventional back-end-of-line W-plug process of depositing W material within a via and performing a CMP process, resulting in the memory element located between the W plug and the subsequently formed TiN material of the top electrode. The plasma oxidation process used to form the $WO_x$ memory element of the memory cell of FIG. 3 was by down stream plasma oxidation (400 sec) in a mixture of nitrogen and oxygen at 150° C. The diameter of the W-plug in FIG. 3 is 0.17 μm.

In the data of FIG. 4 the pulse sets A, B, C, and D of FIG. 2 each comprise a single pulse applied across the tungsten-oxide memory element as summarized in the table below, although it will be understood the present invention is not limited as such and the pulse sets may generally comprise one or more pulses.

| Pulse Set | Voltage (V) | Pulse Length (ns) | Rise Time (ns) | Fall Time (ns) |
|---|---|---|---|---|
| A | 2.5 | 50 | 2 | 2 |
| B | 2.7 | 50 | 2 | 2 |
| C | 3.0 | 50 | 2 | 2 |
| D | −2.0 | 100 | 2 | 2 |

As can be seen in FIG. 4, the resistance window for each state is nearly 2 k ohm and memory windows between the states are maintained after cycling 100 times, demonstrating good cycle endurance and performance for the tungsten-oxide memory element.

In the results of FIG. 4 it can be seen that the resistance distribution of State 1 during cycling is very well controlled, as are the other states. However, it may be desirable in some embodiments to further reduce the fluctuation in the resistance distribution for the other states.

Figure 5:
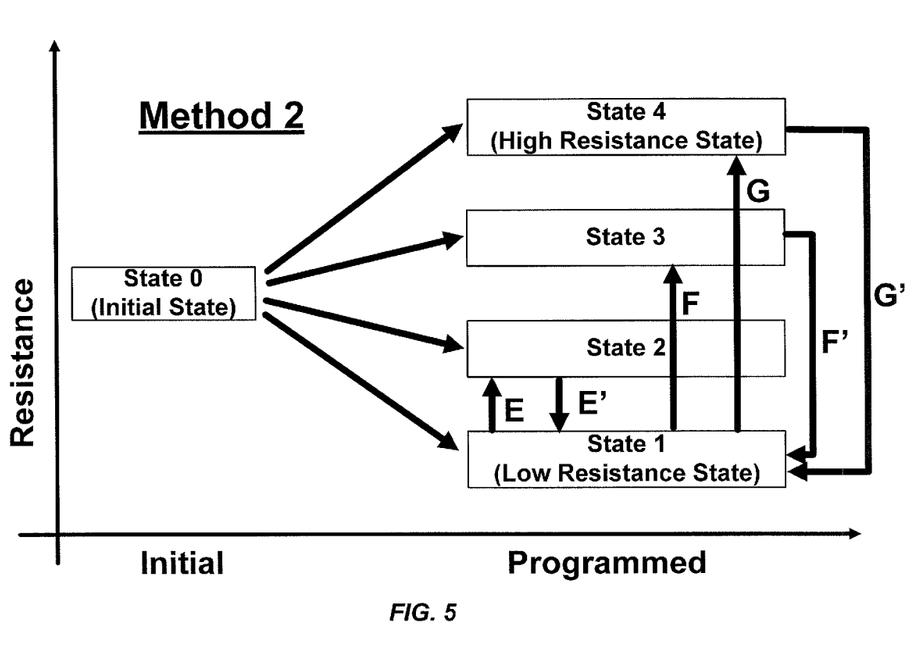
FIG. 5 conceptually illustrates the resistive state change behavior of the memory element along with a second embodiment of a programming operation as described herein.

FIG. 5 conceptually illustrates the resistive state change behavior of memory element 140 of FIG. 1 along with a second embodiment of a programming operation as described herein.

As represented by the arrows in FIG. 5, to change the resistance state of the memory element 140 from each of the higher resistance states (State 2, State 3, State 4) to every other higher resistance state the memory element 140 is always first changed to the lower resistance state (State 1). To change the resistance state from State 1 to State 2 pulse set E is applied across the memory element 140, and to change from State 2 to State 1 pulse set E' is applied across the memory element 140. To change the resistance state from State 1 to State 3 pulse set F is applied across the memory element 140, and to change from State 3 to State 1 pulse set F' is applied across the memory element 140. To change the resistance state from State 1 to State 4 pulse set G is applied across the memory element 140, and to change from State 4 to State 1 pulse set G' is applied across the memory element 140. The pulse sets each comprise one or more pulses, and the levels, polarity across the memory element, and pulse times of the pulses can be determined empirically for each embodiment. In some embodiments pulse sets E', F', and G' are the same.

The programming operation of FIG. 5 involves applying bias arrangements across the memory element 140 comprising a sequence of one or more of pulse sets E, E', F, F', G, and G' to change the resistance state from a particular state to a desired state. For example, the bias arrangement applied across the memory element 140 to change from State 2 to State 3 involves applying pulse set E' to induce a change from State 2 to State 1, and applying pulse set F to induce a change from State 1 to State 3. As another example, the bias arrangement applied across the memory element 140 to change from State 4 to State 2 involves applying pulse set G' to induce a change from State 4 to State 1, and applying pulse set E to change from State 1 to State 2.

Figure 6A:
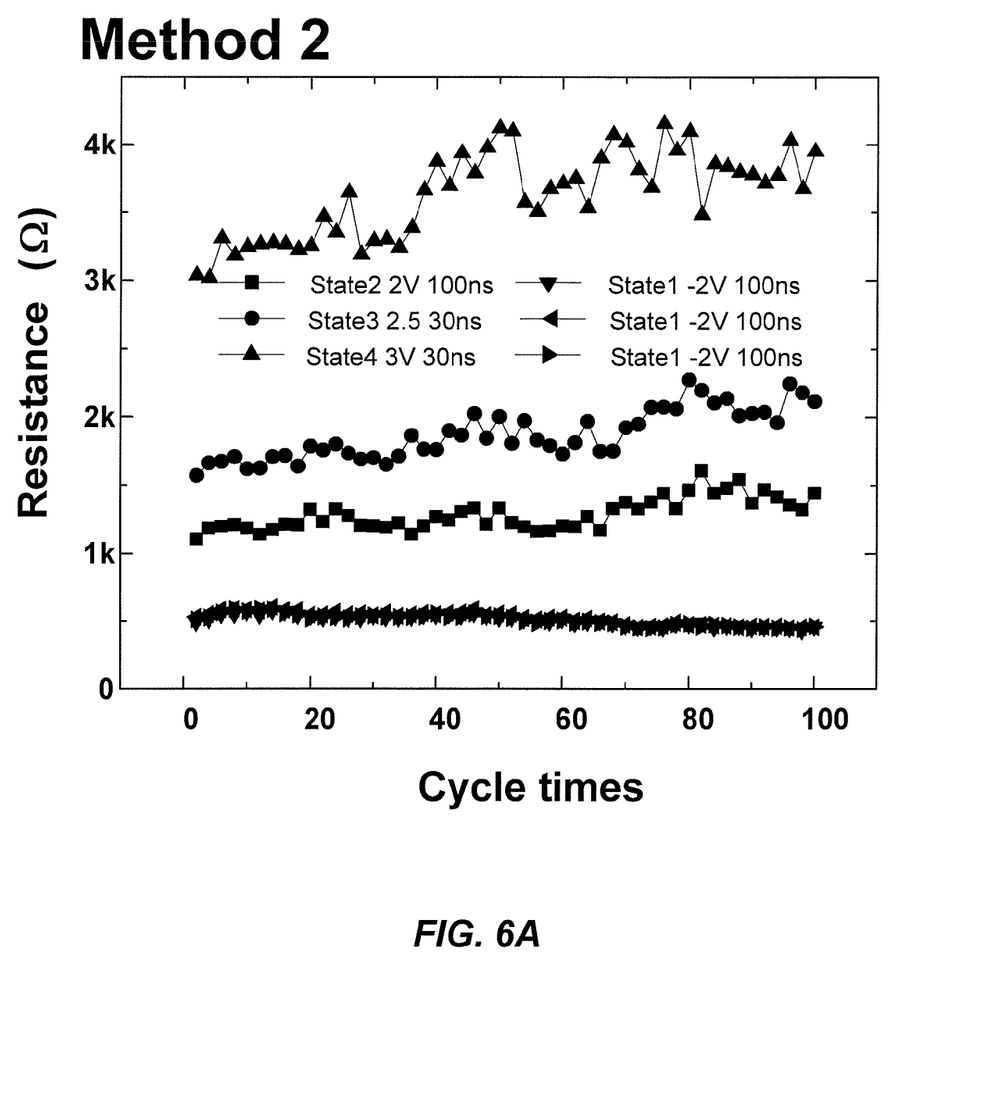
FIGS. 6A and 6B are measured results of the tungsten-oxide memory cell of FIG. 3 using the programming operation of FIG. 5.
Figure 6B:
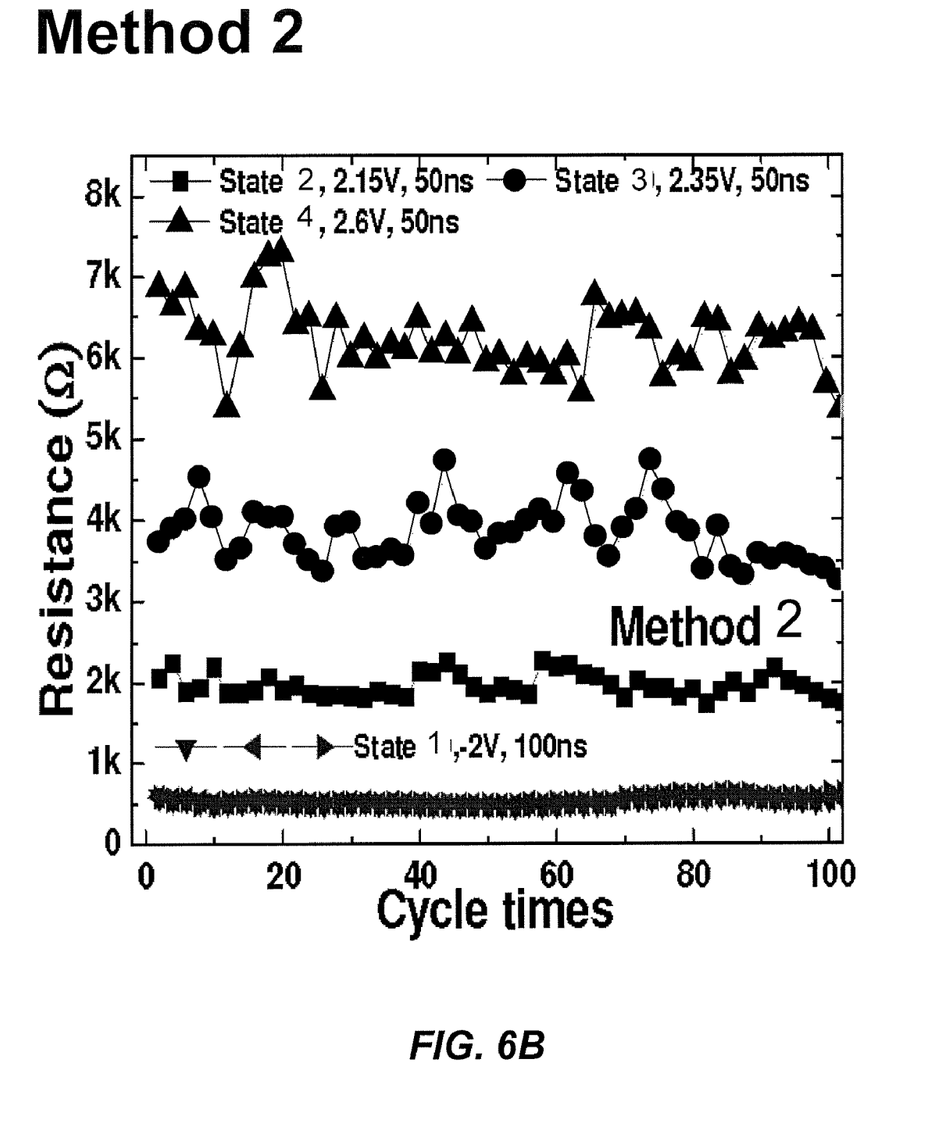

FIGS. 6a and 6b are measured results of the tungsten-oxide memory cell of FIG. 3 using the programming operation of FIG. 5. In the data of FIG. 6a the pulse sets of FIG. 5 each comprise a single pulse applied across the tungsten-oxide memory element as summarized in the table below.

| Pulse Set | Voltage (V) | Pulse Length (ns) | Rise Time (ns) | Fall Time (ns) |
|---|---|---|---|---|
| E | 2.0 | 100 | 2 | 2 |
| E' | −2.0 | 100 | 2 | 2 |
| F | 2.5 | 30 | 2 | 2 |
| F' | −2.0 | 100 | 2 | 2 |
| G | 3.0 | 30 | 2 | 2 |
| G' | −2.0 | 100 | 2 | 2 |

In the data of FIG. 6b the pulse sets of FIG. 5 each comprise a single pulse applied across the tungsten-oxide memory element as summarized below.

| Pulse Set | Voltage (V) | Pulse Length (ns) | Rise Time (ns) | Fall Time (ns) |
|---|---|---|---|---|
| E | 2.15 | 50 | 2 | 2 |
| E' | −2.0 | 100 | 2 | 2 |
| F | 2.35 | 50 | 2 | 2 |

-continued

| Pulse Set | Voltage (V) | Pulse Length (ns) | Rise Time (ns) | Fall Time (ns) |
|---|---|---|---|---|
| F' | −2.0 | 100 | 2 | 2 |
| G | 2.8 | 50 | 2 | 2 |
| G' | −2.0 | 100 | 2 | 2 |

As can be seen in the measured results of FIGS. 6A and 6B, the lower resistance state (State 1) is still well controlled while the other states are also well controlled.

Figure 7:
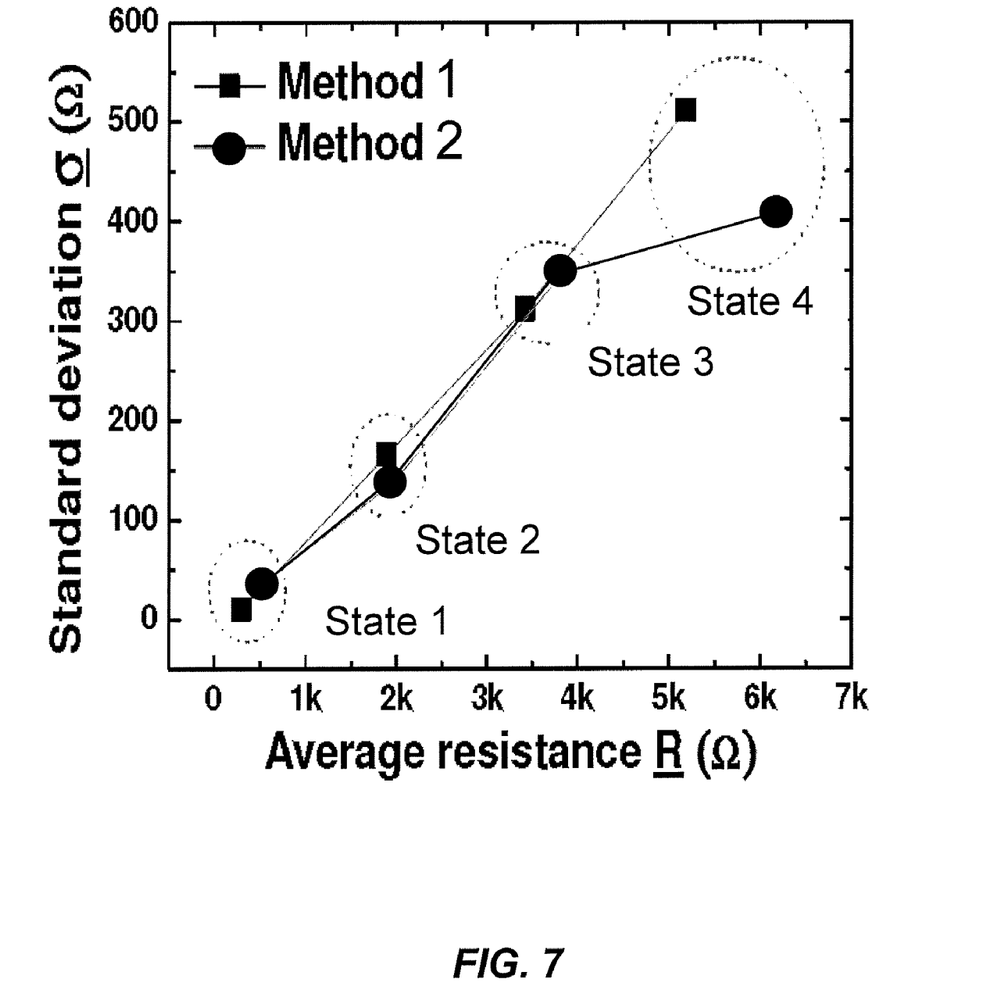
FIG. 7 shows the standard deviation and average resistance of the states of the data of FIGS. 4 and 6B.

FIG. 7 shows the standard deviation and average resistance of the states of the data of FIGS. 4 and 6B. As can be seen in FIG. 7 the standard deviation in the highest resistance state (State 4) of the data of FIG. 6B is significantly reduced.

Figure 8:
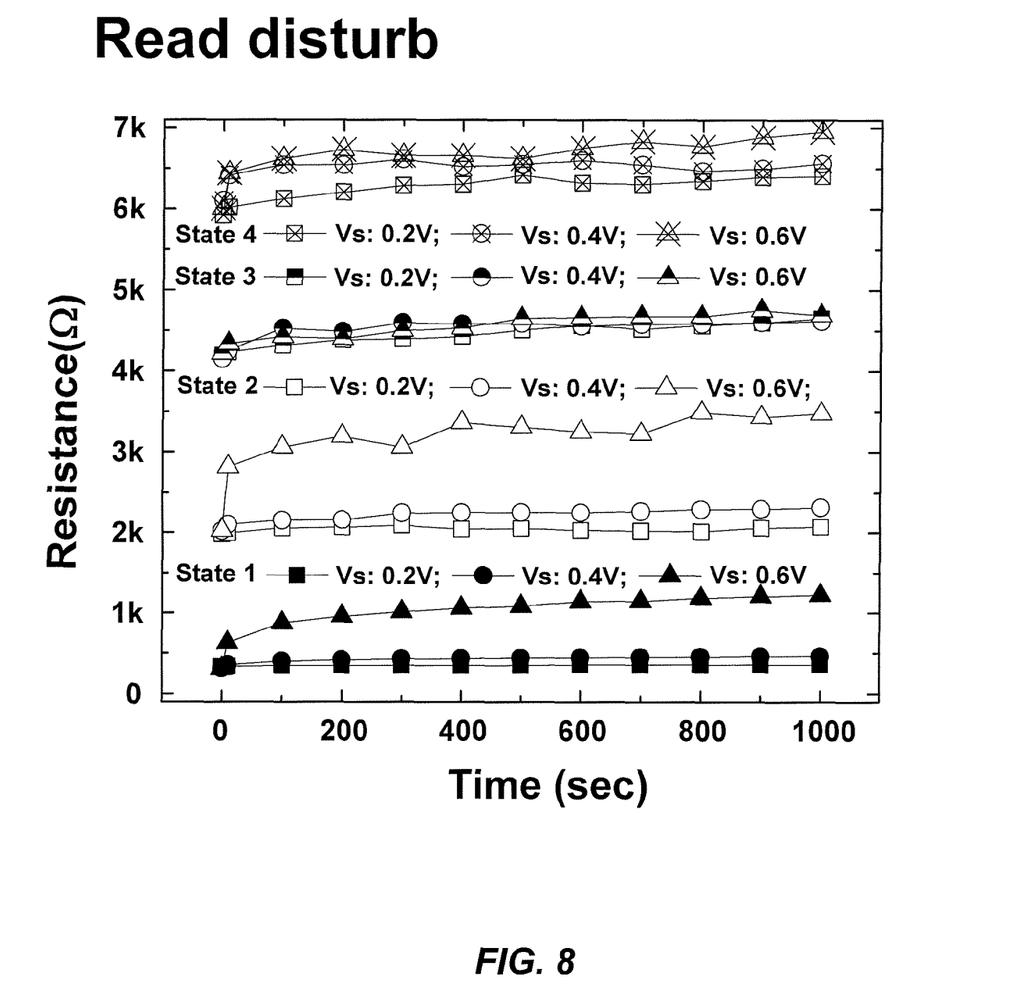
FIG. 8 shows the measured read disturb behavior versus applied voltage across the tungsten-oxide memory element of FIG. 3.

FIG. 8 shows the measured read disturb behavior versus applied voltage of 0.2V, 0.4V, and 0.6V across the tungsten-oxide memory element. In FIG. 8 the various states were initially obtained using the pulses used in obtaining the data in FIG. 6B. The States 3 and 4 show essentially no read disturb and States 1 and 2 show good immunity to read disturb up to 0.4V.

In the operating method of FIG. 2 once the memory element reaches the highest resistance state (State 4) the memory element is set to the lower resistance state (State 1) before being operated to other resistance states. In the operating method of FIG. 5 the memory element is always set to the lower resistance state (State 1) before being set to the other programmed states. The operating methods described herein of returning to the lower resistance state even when the lower resistance state is not the desired programmed state are shown to result in good cycle endurance and good control of the resistance of the memory element, thus addressing the reliability issues discussed above.

The operating methods described herein have been demonstrated for tungsten-oxide memory elements. However, as described below the method may be extended to other metal-oxides such as nickel oxide, aluminum oxide, copper oxide, cobalt oxide, magnesium oxide, hafnium oxide, and titanium oxide. It is theorized that the resistive behavior of metal-oxides such as tungsten-oxide, nickel oxide, aluminum oxide, copper oxide, cobalt oxide, magnesium oxide, hafnium oxide, and titanium oxide may be due to the rupture and formation of filaments (a filament may be composed of ions or vacancies), and that the number of remaining filaments determines the resistance of the metal-oxide. Thus, the operating methods described herein may be extended to other metal-oxides such as tungsten-oxide, nickel oxide, aluminum oxide, copper oxide, cobalt oxide, magnesium oxide, hafnium oxide, and titanium oxide which may be characterized by resistive switching behavior which depends upon the rupture and formation of filaments.

In the results of FIGS. 4 and 6A-6B the pulses used to change the resistance state of the memory element to the lower resistance state (State 1) are of opposite voltage polarity across the memory element than the other pulses used, which may be useful for obtaining good cycle endurance and good control of the resistance of the metal-oxide memory element. It has been observed that using the same voltage polarity across the memory element to change between the states may induce electrical stress in the metal-oxide material sufficient to which may eventually cause damage and failure to the device. Using a voltage pulse of opposite polarity across the memory element may help prevent such damage by allowing for the metal-oxide material to be renewed when changed to the lower resistance state, and the resistance is shown to be well controlled.

Thus, in some embodiments of the operating methods described herein at least one pulse of a set pulse used to induce a change to the lower resistance state has a voltage polarity across the memory element opposite that of at least one pulse of one or more of the other sets of pulses. In yet other embodiments, each pulse of a set of pulses used to induce a change to the lower resistance state has a first voltage polarity across the memory element, and each pulse of one or more of the other sets of pulses has a second voltage polarity across the memory element opposite the first voltage polarity.

FIG. 9 is a simplified block diagram of an integrated circuit 910 in which the operations for switching the resistance of metal-oxide based memory elements as described herein can be implemented. The integrated circuit 910 includes a memory array 912 of memory cells having a metal-oxide memory element programmable to a lower resistance state and a plurality of higher resistance states as described herein. A word line decoder 914 having forming, read and program modes is coupled and in electrical communication with a plurality of word lines 916 arranged along rows in the memory array 912. A bit line (column) decoder 918 is in electrical communication with a plurality of bit lines 920 arranged along columns in the array 912 for reading and programming the metal-oxide based memory cells (not shown) in array 912.

Addresses are supplied on bus 922 to word line decoder and drivers 914 and bit line decoder 918. Sense circuitry (Sense amplifiers) and data-in structures in block 924 are coupled to bit line decoder 918 via data bus 926. Data is supplied via a data-in line 928 from input/output ports on integrated circuit 910, or from other data sources internal or external to integrated circuit 910, to data-in structures in block 924. Other circuitry 930 may be included on integrated circuit 910, such as a general purpose processor or special purpose application circuitry, or a combination of modules providing system-on-a-chip functionality supported by array 912. Data is supplied via a data-out line 932 from the sense amplifiers in block 924 to input/output ports on integrated circuit 210, or to other data destinations internal or external to integrated circuit 210.

The integrated circuit 910 includes a controller 934 for forming, read, and program modes including programming memory cells in array 912 from a first to a second higher resistance state by first programming to the lower resistance state as described herein. The controller, implemented in this example using a bias arrangement state machine, controls the application of bias circuitry voltage & current sources 936 for the application of bias arrangements including forming, read, and program to the word lines, bit lines, and in some embodiments source lines. Controller 934 may be implemented using special-purpose logic circuitry as known in the art. In alternative embodiments, controller 934 comprises a general-purpose processor, which may be implemented on the same integrated circuit to execute a computer program to control the operations of the device. In yet other embodiments, a combination of special purpose logic circuitry and a general-purpose processor may be utilized for implementation of controller 234.

Figure 10:
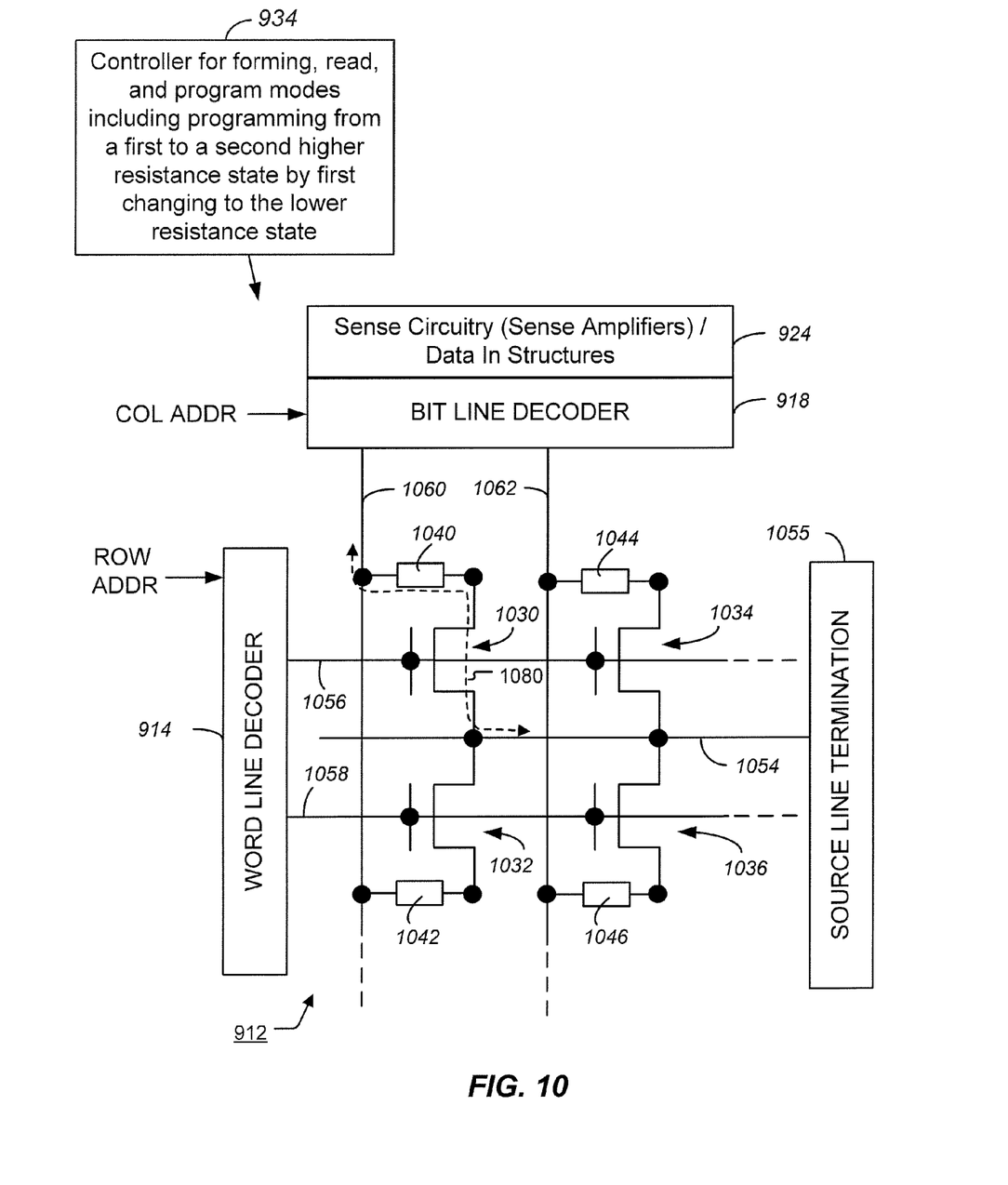
FIG. 10 illustrates a portion of the memory array of FIG. 9.

As shown in FIG. 10, each of the memory cells of array 912 includes an access transistor (or other access device such as a diode) and metal-oxide memory element. In FIG. 10 four memory cells 1030, 1032, 1034, 1036 having respective memory elements 1040, 1042, 1044, 1046 are illustrated, representing a small section of an array that can include millions of memory cells. The memory elements are programmable to a lower resistance state and a plurality of higher resistance states.

Sources of each of the access transistors of memory cells 1030, 1032, 1034, 1036 are connected in common to source line 1054 that terminates in a source line termination circuit 1055, such as a ground terminal. In another embodiment the source lines of the access devices are not electrically connected, but independently controllable. The source line termination circuit 1055 may include bias circuitry such as voltage sources and current sources, and decoding circuits for applying bias arrangements, other than ground, to the source line 1054 in some embodiments.

A plurality of word lines including word lines 1056, 1058 extend in parallel along a first direction. Word lines 1056, 1058 are in electrical communication with word line decoder 914. The gates of access transistors of memory cells 1030 and 1034 are connected to word line 1056, and the gates of access transistors of memory cells 1032 and 1036 are connected in common to word line 1058.

A plurality of bit lines including bit lines 1060, 1062 extend in parallel in a second direction and are in electrical communication with bit line decoder 918. In the illustrated embodiment each of the memory elements are arranged between the drain of the corresponding access device and the corresponding bit line. Alternatively, the memory elements may be on the source side of the corresponding access device.

It will be understood that the memory array 912 is not limited to the array configuration illustrated in FIG. 10, and additional array configurations can also be used. Additionally, instead of MOS transistors, bipolar transistors or diodes may be used as access devices in some embodiments.

In operation each of the memory cells in the array 912 store data depending upon the resistance of the corresponding memory element. The data value may be determined, for example, by comparison of current on a bit line for a selected memory cell to that of suitable reference currents by sense amplifiers of sense circuitry 924. The reference currents can be established so that differing ranges of bit line currents correspond to each of the three or more states.

Reading or writing to a memory cell of array 912, therefore, can be achieved by applying a suitable voltage to one of word lines 1058, 1056 and coupling one of bit lines 1060, 1062 to a voltage source so that current flows through the selected memory cell. For example, a current path 1080 through a selected memory cell (in this example memory cell 1030 and corresponding memory element 1040) is established by applying voltages to the bit line 1060, word line 1056, and source line 1054 sufficient to turn on the access transistor of memory cell 1030 and induce current in path 1080 to flow from the bit line 1060 to the source line 1054, or vice-versa. The level and duration of the voltages applied is dependent upon the operation performed, e.g. a reading operation or a writing operation.

In a read (or sense) operation of memory cell 1030, word line decoder 914 facilitates providing word line 1056 with a suitable voltage to turn on the access transistor of the memory cell 1030. Bit line decoder 918 facilitates supplying a voltage to bit line 1060 of suitable amplitude and duration to induce current in path 1080 that does not result in the memory element 1040 undergoing a change in resistive state. The current on the bit line 1060 and through the memory element 1040 is dependent upon the resistance of the memory element 1040 and thus the data value stored in the memory cell 1030. Thus, the data value stored in the memory cell 1030 may be determined, for example, by comparison of the current on bit line 1060 with a suitable reference current by sense amplifiers of sense circuitry 924.

In a program (or set) operation of a data value to be stored in the memory cell 1030, bias circuitry (See, for example, bias circuitry voltage & current sources 936 of FIG. 9) coupled to the array applies bias arrangements comprising one or more pulses to the bit line 1060 and/or word line 1056 and/or source line 1054 to induce current in path 380. The resultant pulses across the memory element 1040 induce a programmable change in the memory element 1040 by the programming operations described herein to store the data value in the memory cell 1030.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for operating a memory device comprising a plurality of metal-oxide memory elements programmable to a plurality of resistance states, the method comprising:

applying a sequence of bias arrangements across a selected metal-oxide memory element to change a resistance state of the selected metal-oxide memory element from a first resistance state in the plurality of resistance states to a second resistance state in the plurality of resistance states, the applying the sequence of bias arrangements comprising:

applying a first set of one or more pulses to change the resistance state of the selected metal-oxide memory element from the first resistance state to a third resistance state in the plurality of resistance states; and applying a second set of one or more pulses to change the resistance state of the selected metal-oxide memory element from the third resistance state to the second resistance state.

2. The method of claim 1, wherein the third resistance state is lower than the first and second resistance states.

3. The method of claim 1, wherein the third resistance state is the lowest resistance state used to represent data in the selected metal-oxide memory element.

4. The method of claim 1, wherein at least one pulse in the first set of one or more pulses has a voltage polarity across the selected metal-oxide memory element opposite that of at least one pulse in the second set of one or more pulses.

5. The method of claim 4, wherein:

each pulse in the first set of one or more pulses has a first voltage polarity across the selected metal-oxide memory element; and each pulse in the second set of one or more pulses has a second voltage polarity across the selected metal-oxide memory element opposite the first voltage polarity.

6. The method of claim 1, wherein the first resistance state is higher than the second resistance state, and further comprising applying a second bias arrangement across the selected metal-oxide memory element to change the resistance state of the selected metal-oxide memory element from the second resistance state to the first resistance state.

7. The method of claim 6, wherein applying the second bias arrangement comprises applying a third set of one or more pulses to change the resistance state of the selected metal-oxide memory element from the second resistance state to the first resistance state.

8. The method of claim 7, wherein applying the third set changes the resistance state of the selected metal-oxide memory element directly from the second resistance state to the first resistance state.

9. The method of claim 7, wherein applying the third set comprises:
applying a first group of one or more pulses in the third set to change the resistance state of the selected metal-oxide memory element from the second resistance state to the third resistance state; and
applying a second group of one or more pulses in the third set to change the resistance state of the selected metal-oxide memory element from the third resistance state to the first resistance state.

10. The method of claim 9, wherein at least one pulse in the first group has a voltage polarity across the selected metal-oxide memory element opposite that of at least one pulse in the second group of one or more pulses.

11. The method of claim 10, wherein:
each pulse in the first group of one or more pulses has a first voltage polarity across the selected metal-oxide memory element; and
each pulse in the second group of one or more pulses has a second voltage polarity across the selected metal-oxide memory element opposite the first voltage polarity.

12. The method of claim 1, further comprising applying respective bias arrangements across the selected metal-oxide memory element to change the resistance state of the selected metal-oxide memory element from each resistance state in the plurality of resistance states to every other resistance state in the plurality of resistance states, the applying the respective bias arrangements including applying a corresponding set of one or more pulses to first change the resistance state of the selected metal-oxide memory element to the third resistance state.

13. The method of claim 1, wherein the first resistance state in the plurality of resistance states is a highest resistance state, and further comprising applying respective bias arrangements across the selected metal-oxide memory element to change the resistance state of the selected metal-oxide memory element from a particular resistance state in the plurality of resistance states to the first resistance state, the applying the respective bias arrangements including:
applying a first corresponding set of one or more pulses to change the resistance state of the selected metal-oxide memory element from the particular resistance state to an intermediate resistance state in the plurality of resistance states between the particular resistance state and the first resistance state; and
applying a second corresponding set of one or more pulses to change the resistance state of the selected metal-oxide memory element from the intermediate state to the first resistance state.

14. The method of claim 1, wherein the selected metal-oxide memory element comprises tungsten oxide.

15. The method of claim 1, wherein the selected metal-oxide memory element comprises a metal-oxide from the group of nickel oxide, aluminum oxide, copper oxide, cobalt oxide, magnesium oxide, hafnium oxide, and titanium oxide.

* * * * *